(12) United States Patent
Lin et al.

(10) Patent No.: US 11,264,270 B2
(45) Date of Patent: Mar. 1, 2022

(54) AIR-REPLACED SPACER FOR SELF-ALIGNED CONTACT SCHEME

(71) Applicant: Taiwan Semiconductor Manufacturing Co., Ltd., Hsinchu (TW)

(72) Inventors: Meng-Yu Lin, Hsinchu (TW); Chun-Fu Cheng, Zhubei (TW); Chung-Wei Wu, Ju-Bei (TW); Zhiqiang Wu, Chubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 1 day.

(21) Appl. No.: 16/823,943

(22) Filed: Mar. 19, 2020

(65) Prior Publication Data

US 2021/0125858 A1 Apr. 29, 2021

Related U.S. Application Data

(60) Provisional application No. 62/927,390, filed on Oct. 29, 2019.

(51) Int. Cl.
*H01L 21/768* (2006.01)
*H01L 21/02* (2006.01)

(52) U.S. Cl.
CPC .... *H01L 21/76802* (2013.01); *H01L 21/0217* (2013.01); *H01L 21/02362* (2013.01); *H01L 21/7682* (2013.01); *H01L 21/76832* (2013.01); *H01L 21/76897* (2013.01)

(58) Field of Classification Search
CPC ........... H01L 21/76802; H01L 21/0217; H01L 21/02362; H01L 21/76832; H01L 21/76897
See application file for complete search history.

(56) References Cited

U.S. PATENT DOCUMENTS

| | | | |
|---|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |

(Continued)

*Primary Examiner* — Zandra V Smith
*Assistant Examiner* — Andre C Stevenson
(74) *Attorney, Agent, or Firm* — Sterne, Kessler, Goldstein & Fox P.L.L.C.

(57) ABSTRACT

The present disclosure describes a method of fabricating a semiconductor structure that includes forming a dummy gate structure over a substrate, forming a first spacer on a sidewall of the dummy gate structure and a second spacer on the first spacer, forming a source/drain structure on the substrate, removing the second spacer, forming a dielectric structure over the source/drain structure, replacing the dummy gate structure with a metal gate structure and a capping structure on the metal gate structure, and forming an opening in the dielectric structure. The opening exposes the source/drain structure. The method further includes forming a dummy spacer on a sidewall of the opening, forming a contact structure in the opening, and removing the dummy spacer to form an air gap between the contact structure and the metal gate structure. The contact structure is in contact with the source/drain structure in the opening.

20 Claims, 13 Drawing Sheets

(56) References Cited

U.S. PATENT DOCUMENTS

| | | |
|---|---|---|
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 10,886,378 B2 * | 1/2021 | Xie .................. H01L 21/76895 |
| 2015/0214341 A1 * | 7/2015 | Shin .................. H01L 29/7851 |
| | | 257/401 |
| 2020/0279745 A1 * | 9/2020 | Cheng .............. H01L 29/66568 |

* cited by examiner

AIR-REPLACED SPACER FOR SELF-ALIGNED CONTACT SCHEME

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

Illustrative embodiments will now be described with reference to the accompanying drawings. In the drawings, like reference numerals generally indicate identical, functionally similar, and/or structurally similar elements.

DETAILED DESCRIPTION

Figure 1A:
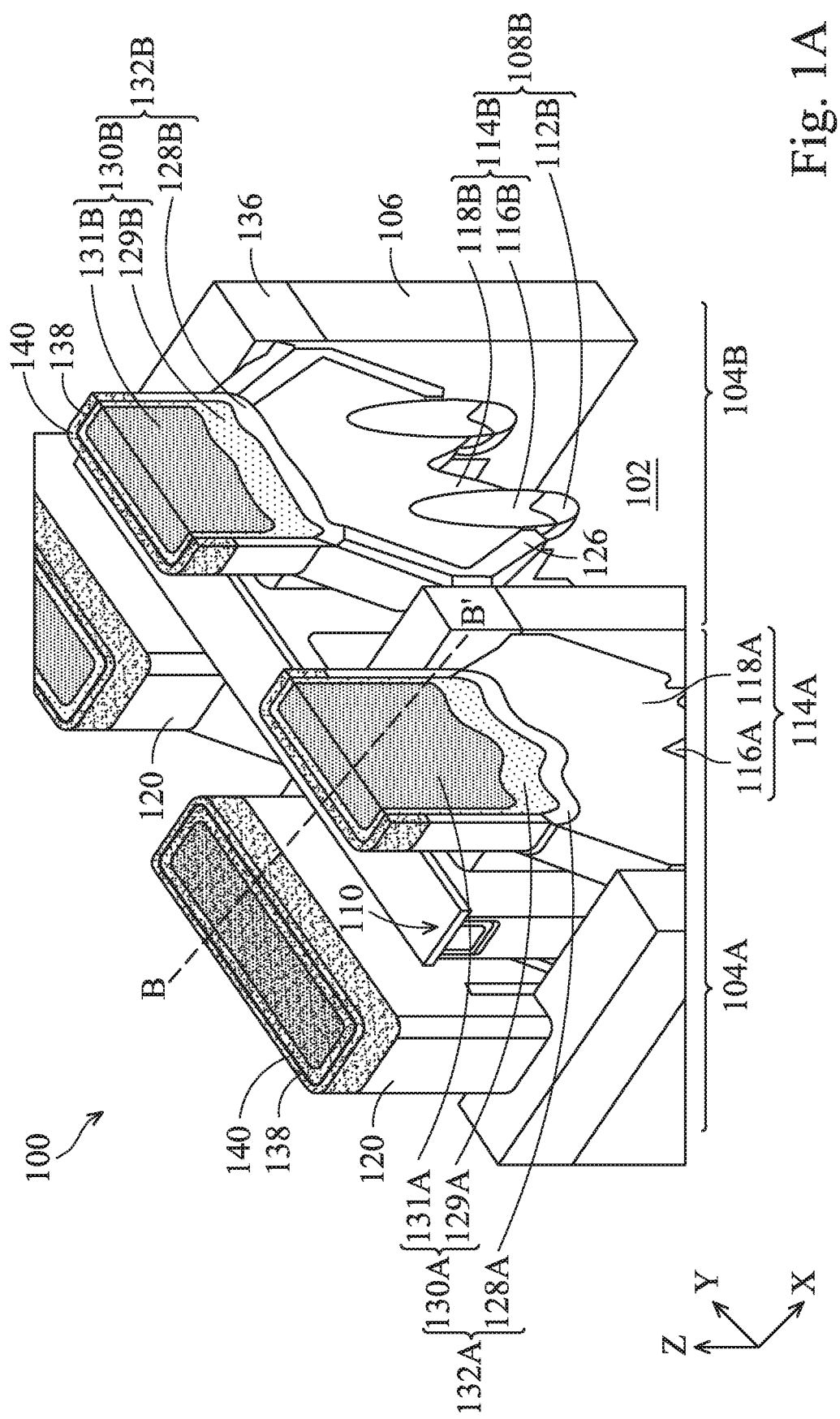
FIGS. 1A and 1B illustrate a partial isometric view and a partial cross-sectional view of a semiconductor device with air-replaced spacers, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

As used herein, the term "etch selectivity" refers to the ratio of the etch rates of two different materials under the same etching conditions.

As used herein, the term "substrate" describes a material onto which subsequent material layers are added. The substrate itself may be patterned. Materials added on top of the substrate may be patterned or may remain unpatterned. Furthermore, the substrate may be a wide array of semiconductor materials, such as silicon, germanium, gallium arsenide, indium phosphide, etc. Alternatively, the substrate may be made from an electrically non-conductive material, such as glass and sapphire wafer.

As used herein, the term "high-k" refers to a high dielectric constant. In the field of semiconductor device structures and manufacturing processes, high-k refers to a dielectric constant that is greater than the dielectric constant of $SiO_2$ (e.g., greater than about 3.9).

As used herein, the term "low-k" refers to a small dielectric constant. In the field of semiconductor device structures and manufacturing processes, low-k refers to a dielectric constant that is less than the dielectric constant of $SiO_2$ (e.g., less than about 3.9).

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

As used herein, the term "vertical," means nominally perpendicular to the surface of a substrate.

In some embodiments, the terms "about" and "substantially" can indicate a value of a given quantity that varies within 5% of a target value (e.g., ±1, 2%, 3%, 4%, and ±5% of the target value).

Embodiments of the fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, forming patterns that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The performance of semiconductor devices increases with advances in semiconductor technology. For example, complementary metal-oxide-semiconductor (CMOS) transistors are increasingly faster with every new generation of semiconductor technology. One way to improve CMOS transistor speed is to reduce the delay of the device. For example, reducing the resistance-capacitance (RC) delay of the CMOS transistor improves speed and thus device AC performance.

One consideration to reduce the RC delay of a transistor is to use a dielectric with a low dielectric constant (k value). Such a dielectric is also referred to as a "low-k dielectric." For example, the use of a low-k dielectric as a spacer that surrounds a CMOS gate structure can lower a capacitance between the CMOS gate and surrounding portions of the CMOS transistor. With the lower dielectric capacitance, the transistor's RC delay can be reduced. Compared with other low-k dielectric materials, an air-replaced spacer has lower k value of about 1. Therefore, the air-replaced spacer between the gate structure and the self-aligned source/drain contact (SAC) structure of the CMOS transistor can provide lower capacitance, and thus smaller RC delay and faster speed for the CMOS transistor.

Various embodiments in accordance with the present disclosure provide methods for forming an air-replaced spacer with gate spacer trim to reduce the capacitance between the gate structure and the SAC structure. According to some embodiments, the air-replaced spacer can be formed between the gate structure and the SAC structure through deposition and removal of a dummy silicon spacer. In some embodiments, the size of the air-replaced spacer can be tuned by the size of the dummy silicon spacer. In some embodiments, a silicon nitride layer can be formed between the dummy silicon spacer and the SAC structure to prevent silicide extrusion into the air-replaced spacer and damage of epitaxial structures in the source/drain region. In some embodiments, a portion of the gate spacer can be etched (referred to as "gate spacer trim") to increase the dimension of the SAC structure between adjacent gate structures. In some embodiments, compared with CMOS transistors without air-replaced spacers, CMOS transistors having air-replaced spacers with gate spacer trims can have improved device AC performance. In some embodiments, device AC performance of CMOS transistors having the air-replaced spacer with gate spacer trim can be improved by at least about 1.5%.

Figure 1B:
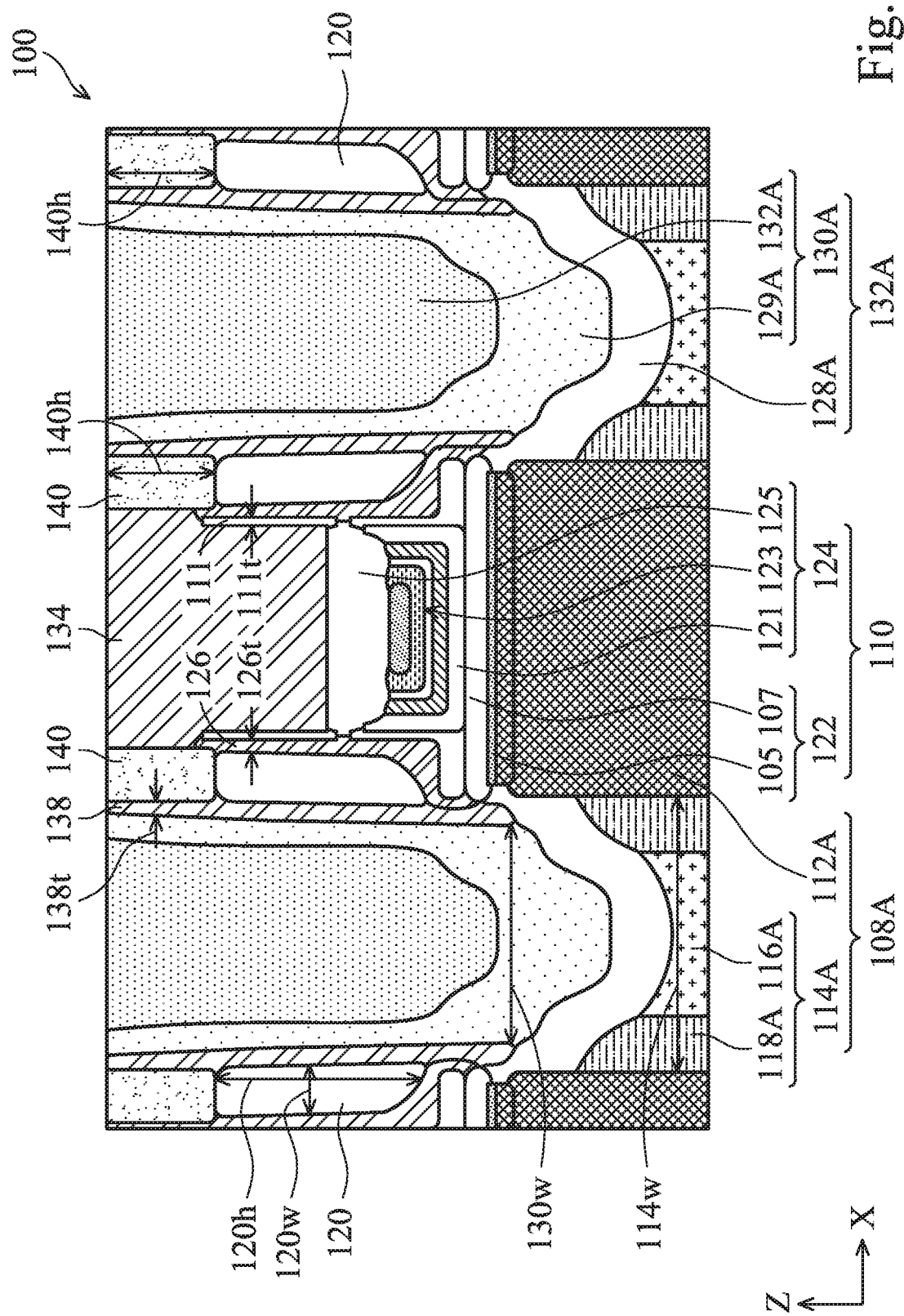

FIG. 1A illustrates a partial isometric view of a semiconductor device 100 with an air-replaced spacers 120, in accordance with some embodiments. FIG. 1B illustrates a partial cross-sectional view along line B-B' of semiconductor device 100 with air-replaced spacers 120, in accordance with some embodiments. In some embodiments, FIGS. 1A and 1B show a portion of an IC layout where the spacing between the fin structures (e.g., the fin pitch), the dimensions of the fin structures, and the dimensions of the gate structures can be similar or different from the ones shown in FIGS. 1A and 1B. Additionally, the isometric and cross-sectional views of semiconductor device 100 in FIGS. 1A and 1B and the subsequent figures are for illustrative purposes and are not to scale. FIGS. 1A and 1B and the subsequent figures may not reflect the actual geometry of the actual structures, features, or films. Some structures, films, or geometries may have been deliberately augmented for illustrative purposes.

Referring to FIGS. 1A and 1B, semiconductor device 100 can be formed on a substrate 102 and can include finFETs 104A and 104B. In some embodiments, finFET 104A can be an NFET (also referred to as "NFET 104A") and finFET 104B can be a PFET (also referred to as "PFET 104B"). Though FIGS. 1A and 1B show one NFET 104A and one PFET 104B for simplicity, semiconductor device 100 can have any number of NFETs similar to NFET 104A and any number of PFETs similar to PFET 104B. Also, though FIGS. 1A and 1B show one gate structure 110, semiconductor device 100 can have additional gate structures similar and parallel to gate structure 110. In addition, semiconductor device 100 can be incorporated into an integrated circuit through the use of other structural components, such as gate contact structures, conductive vias, conductive lines, dielectric layers, passivation layers, etc., that are not shown for simplicity. The discussion of elements of finFET 104A and 104B with the same annotations applies to each other, unless mentioned otherwise. Semiconductor device 100 can further include shallow trench isolation (STI) regions 106, fin structures 108A and 108B, gate structure 110, and gate spacers 111 disposed on opposite sides of gate structure 110.

FinFETs 104A and 104B can be formed on a substrate 102. Substrate 102 can be a semiconductor material, such as silicon. In some embodiments, substrate 102 can include a crystalline silicon substrate (e.g., wafer). In some embodiments, substrate 102 can include (i) an elementary semiconductor, such as germanium (Ge); (ii) a compound semiconductor including silicon carbide (SiC), silicon arsenide (SiAs), gallium arsenide (GaAs), gallium phosphide (GaP), indium phosphide (InP), indium arsenide (InAs), indium antimonide (InSb), and/or a III-V semiconductor material; (iii) an alloy semiconductor including silicon germanium (SiGe), silicon germanium carbide (SiGeC), germanium stannum (GeSn), silicon germanium stannum (SiGeSn), gallium arsenic phosphide (GaAsP), gallium indium phosphide (GaInP), gallium indium arsenide (GaInAs), gallium indium arsenic phosphide (GanAsP), aluminum indium arsenide (AlInAs), and/or aluminum gallium arsenide (AlGaAs); (iv) a silicon-on-insulator (SOI) structure; (v) a silicon germanium (SiGe)-on insulator structure (SiGeOI); (vi) germanium-on-insulator (GeOI) structure; or (vii) a combination thereof. Further, substrate 102 can be doped depending on design requirements (e.g., p-type substrate or n-type substrate). In some embodiments, substrate 102 can be doped with p-type dopants (e.g., boron, indium, aluminum, or gallium) or n-type dopants (e.g., phosphorus or arsenic).

STI regions 106 can provide electrical isolation between finFETs 104A and 104B from each other and from neighboring finFETs with different fin structures (not shown) on substrate 102 and/or neighboring active and passive elements (not shown) integrated with or deposited on substrate 102. STI regions 106 can be made of a dielectric material. In some embodiments, STI regions 106 can include silicon oxide, silicon nitride, silicon oxynitride, fluorine-doped silicate glass (FSG), a low-k dielectric material, and/or other suitable insulating materials. In some embodiments, STI regions 106 can include a multi-layered structure.

Fin structures 108A of NFET 104A and 108B of PFET 104B can extend along an X-axis and through gate structure 110. Fin structures 108A and 108B can include fin base regions 112A and 112B and can also include epitaxial fin regions 114A and 114B disposed on fin base regions 112A and 112B, respectively. Portions of fin base regions 112A and 112B extending above STI regions 106 can be wrapped around by gate structure 110 (not shown). In some embodiments, fin base regions 112A and 112B can include materials similar to substrate 102. In some embodiments, fin base regions 112A and 112B can be formed from a photolithographic patterning and an etching of substrate 102. Based on the disclosure herein, it will be recognized that other materials and formation processes for fin base regions 112A and 112B are within the scope and spirit of this disclosure.

In some embodiments, epitaxial fin regions 114A and 114B can be grown on portions of respective fin base regions 112A and 112B that are not underlying gate structure 110, as illustrated in FIGS. 1A and B. Epitaxial fin regions 114A and 114B can include first epitaxial fin sub-regions 116A and 116B and can also include second epitaxial fin sub-regions 118A and 118B. In some embodiments, epitaxial fin regions 114A and 114B can have any geometric shape, such as a polygon, an ellipsis, and a circle. In some embodiments, epitaxial fin regions 114A and 114B on different fin base regions 112A and 112B can merge with adjacent epitaxial fin regions, respectively, as shown in FIGS. 1A and 1B. In some embodiments, epitaxial fin regions 114A and 114B can be unmerged (not shown) from adjacent epitaxial fin regions on separate fin base regions 112A and 112B, respectively.

Epitaxial fin regions 114A and 114B can include an epitaxially-grown semiconductor material. In some embodiments, the epitaxially-grown semiconductor material is the same material as the material of substrate 102. In some embodiments, the epitaxially-grown semiconductor material can include a different material from the material of substrate 102. The epitaxially-grown semiconductor material can include: (i) a semiconductor material, such as germanium and silicon; (ii) a compound semiconductor material, such as gallium arsenide and aluminum gallium arsenide; or (iii) a semiconductor alloy, such as silicon germanium and gallium arsenide phosphide.

In some embodiments, epitaxial fin regions 114A can be n-type for NFET 104A (also referred to as "n-type epitaxial fin regions 114A") and epitaxial fin regions 114B can be p-type for PFET 104B (also referred to as "p-type epitaxial fin regions 114B").

In some embodiments, n-type epitaxial fin regions 114A can include Si and can be in-situ doped during an epitaxial growth process using n-type dopants, such as phosphorus and arsenic. In some embodiments, n-type epitaxial fin regions 114A can have a plurality of n-type epitaxial fin sub-regions that can differ from each other based on, for example, doping concentration and/or epitaxial growth process conditions. Referring to FIGS. 1A and 1B, n-type epitaxial fin regions 114A can include first epitaxial fin sub-regions 116A and second epitaxial fin sub-regions 118A. First and second epitaxial fin sub-regions 116A and 118A can have different n-type dopant concentrations, according to some embodiments. In some embodiments, second epitaxial fin sub-regions 118A can have a higher n-type dopant concentration than first epitaxial fin sub-regions 116A.

In some embodiments, p-type epitaxial fin regions 114B can include SiGe and can be in-situ doped during an epitaxial growth process using p-type dopants, such as boron, indium, and gallium. In some embodiments, p-type epitaxial fin regions 114B can have a plurality of sub-regions that can include SiGe and can differ from each other based on, for example, doping concentration, epitaxial growth process conditions, and/or relative concentration of Ge with respect to Si. For example, referring to FIGS. 1A and 1B, p-type epitaxial fin regions 114B can include first epitaxial fin sub-regions 116B and second epitaxial fin sub-regions 118B. First and second epitaxial fin sub-regions 116B and 118B can have different p-type dopant concentrations, according to some embodiments. In some embodiments, second epitaxial fin sub-regions 118B can have a higher p-type dopant concentration than first epitaxial fin sub-regions 116B.

According to some embodiments, first epitaxial fin sub-regions 116A and 116B can serve as buffers between fin base regions 112A and second epitaxial fin sub-regions 118A and between fin base regions 112B and second epitaxial fin sub-regions 118B to reduce leakage current during an off-stage of finFETs 104A and 104B.

Referring to FIGS. 1A and 1B, fin structures 108A and 108B can be current-carrying structures for respective finFETs 104A and 104B. Epitaxial fin regions 114A and 114B can function as source/drain (S/D) regions of respective finFETs 104A and 104B. Channel regions of finFETs 104A and 104B can be formed in portions of their respective fin base regions 112A and 112B underlying gate structure 110.

Gate structure 110 can include a gate dielectric layer 122 and a gate electrode 124. Gate structure 110 can be formed by a gate replacement process.

In some embodiments, gate dielectric layer 122 is adjacent to and in contact with gate electrode 124. Gate dielectric layer 122 can include an interfacial oxide layer 105 and a high-k gate dielectric layer 107. Interfacial oxide layer 105 can include silicon oxide and have a thickness ranging from about 0.5 nm to about 1.5 nm. High-k gate dielectric layer 107 can have a thickness ranging from about 1 nm to about 3 nm and can include (i) a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$), (ii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iii) a combination thereof.

Gate electrode 124 can include a gate barrier layer 121, a gate work function metal layer 123, and a gate metal fill layer 125. In some embodiments, gate barrier layer 121 is disposed on gate dielectric layer 122. Gate barrier layer 121 can serve as a nucleation layer for subsequently-formed gate work function layers and/or can help prevent substantial diffusion of metals (e.g., Al) from gate work function layers to underlying layers (e.g., gate dielectric layer 122). Gate barrier layer 121 can include titanium (Ti), tantalum (Ta), titanium nitride (TiN), tantalum nitride (TaN), or other suitable diffusion barrier materials. In some embodiments, gate barrier layer 121 can include substantially fluorine-free metal or metal-containing film.

In some embodiments, gate work function metal layer 123 can include a single metal layer or a stack of metal layers. The stack of metal layers can include metals having work functions similar to or different from each other. In some embodiments, gate work function metal layer 123 can include, for example, aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAN), tungsten nitride (WN), metal alloys, or combinations thereof.

Gate metal fill layer 125 can include a single metal layer or a stack of metal layers. The stack of metal layers can include metals different from each other. In some embodiments, gate metal fill layer 125 can include a suitable conductive material, such as Ti, silver (Ag), Al, titanium aluminum nitride (TiAlN), tantalum carbide (TaC), tantalum carbo-nitride (TaCN), tantalum silicon nitride (TaSiN), manganese (Mn), Zr, titanium nitride (TiN), tantalum nitride (TaN), ruthenium (Ru), molybdenum (Mo), tungsten nitride (WN), copper (Cu), tungsten (W), cobalt (Co), nickel (Ni), titanium carbide (TiC), titanium aluminum carbide (TiAlC), tantalum aluminum carbide (TaAlC), metal alloys, and combinations thereof.

Gate spacers 111 can be formed on sidewalls of gate structure 110 and can be in contact with gate dielectric layer 122. Gate spacers 111 can include insulating material, such as silicon oxide, silicon nitride, a low-k material, and a combination thereof. Gate spacers 111 can have a low-k material with a dielectric constant less than 3.9 (e.g., less than 3.5, 3, or 2.8). In some embodiments, gate spacers 111 can include a single layer or multiple layers of insulating materials. In some embodiments, gate spacers 111 can isolate gate structure 110 and source/drain (S/D) contact structures 132A-132B. In some embodiments, gate spacers 111 can have a thickness 111t along an X-axis ranging from about 0.1 nm to about 6 nm. If thickness 111t is thinner than about 0.1 nm, gate structure 110 and S/D contact structures 132A and 132B may have an electrical short. If thickness 111t is thicker than about 6 nm, the horizontal dimensions of S/D contact structures 132A and 132B along an X-axis may be reduced and device DC performance may be degraded. In some embodiments, gate spacer thickness 111t can be reduced by a gate spacer trim to shift air-replaced spacer 120 closer to gate structure 110 and increase the width of S/D contact structures 132A-132B.

Referring to FIGS. 1A and 1B, semiconductor device 100 can further include air-replaced spacers 120, etch stop layer (ESL) 126, gate capping structures 134, interlayer dielectric (ILD) layer 136, S/D contact structures 132A-132B of respective finFETs 104A and 104B, dielectric layer 138, and seal spacer 140, according to some embodiments.

Air-replaced spacers 120 can be formed between gate structure 110 and S/D contact structures 132A-132B. In some embodiments, air-replaced spacers 120 can surround S/D contact structures 132A-132B with dielectric layer 138 in between air-replaced spacers 120 and gate structure 110. In some embodiments, air-replaced spacers 120 can be filled with air and can have a dielectric constant about 1 to reduce the capacitance between gate structure 110 and S/D contact structures 132A-132B. Without air-replaced spacer 120, gate spacers between gate structure 110 and S/D contact structures 132A-132B can include insulating materials, such as silicon oxide, silicon nitride, a low-k material, and a combination thereof. The dielectric constant of these insulating materials can range from about 2 to about 7.4, which is higher than the dielectric constant of air of about 1. Therefore, air-replaced spacers 120 can reduce the dielectric constant and capacitance between gate structure 110 and S/D contact structures 132A-132B, thus improving device AC performance. In some embodiments, compared with CMOS transistors without air-replaced spacer, CMOS transistors having air-replaced spacers 120 with reduced gate spacer thickness 111t can have comparable DC performance and improved device AC performance. In some embodiments, device AC performance of CMOS transistors having air-replaced spacers 120 can be improved by at least about 1.5%.

In some embodiments, the horizontal dimension and vertical dimension of air-replaced spacers 120 can be tuned to further reduce the capacitance between gate structure 110 and S/D contact structures 132A-132B. In some embodiments, the vertical dimension of seal spacer 140 and desired device AC performance improvement can affect the horizontal and vertical dimensions of air-replaced spacers 120. In some embodiments, air-replaced spacers 120 can have a horizontal dimension along an X-axis (e.g., width) 120w ranging from about 1 nm to about 4 nm. If horizontal dimension 120w is smaller than about 1 nm, device AC performance may not be improved. If horizontal dimension 120w is larger than about 4 nm, air-replaced spacers 120 may not be sealed. In some embodiments, air-replaced spacers 120 can have a vertical dimension along a Z-axis (e.g., height) 120h ranging from about 8 nm to about 16 nm. If vertical dimension 120h is smaller than about 8 nm, device AC performance may not be improved. If vertical dimension 120h is larger than about 16 nm, corner rounding may occur during dummy spacer etching to form air-replaced spacers 120.

ESL 126 can be formed on sidewalls of gate spacers 111 and on epitaxial fin regions 114A and 114B. ESL 126 can protect gate structure 110 and/or portions of epitaxial fin regions 114A and 114B that are not in contact with S/D contact structures 132A-132B. This protection can be provided, for example, during formation of ILD layer 136 and/or S/D contact structures 132A-132B. In some embodiments, ESL 126 can include, for example, silicon nitride ($SiN_x$), silicon oxide ($SiO_x$), silicon oxynitride (SiON), silicon carbide (SiC), silicon carbo-nitride (SiCN), boron nitride (BN), silicon boron nitride (SiBN), silicon carbon boron nitride (SiCBN), or a combination thereof. In some embodiments, ESL 126 can include silicon nitride or silicon oxide formed by low pressure chemical vapor deposition (LPCVD), plasma enhanced chemical vapor deposition (PECVD), chemical vapor deposition (CVD), or silicon oxide formed by a high-aspect-ratio process (HARP). In some embodiments, ESL 126 can have a thickness 126t along an X-axis in a range from about 1 nm to about 5 nm.

Gate capping structures 134 can be disposed on gate structure 110 and configured to protect underlying structures and/or layers during subsequent processing of semiconductor device 100. For example, gate capping structures 134 can act as an etch stop layer during the formation of S/D contact structures 132A-132B. Gate capping structures 134 can include one or more layers of insulating material having (i) a nitride-based material, such as silicon nitride, silicon-rich nitride, silicon oxynitride, and titanium nitride; (ii) a carbide-based material, such as silicon carbide, titanium carbide, tungsten carbide, and other suitable metal carbides; (iii) an elementary semiconductor, such as silicon; (iv) a metal oxide-based material; or (v) a combination thereof. In some embodiments, gate capping structures 134 can include a stack of layers of insulating material, where each layer of the stack can have a material and dimensions different from each other layers in the stack.

ILD layer 136 can be disposed on ESL 126 and can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). In some embodiments, the dielectric material can be silicon oxide.

S/D contact structures 132A-132B can electrically connect respective S/D regions (e.g., epitaxial fin regions 114A and 114B) of finFETs 104A and 104B to other elements of semiconductor device 100 and/or of the integrated circuit. S/D contact structures 132A-132B can be formed within ILD layer 136. According to some embodiments, S/D contact structures 132A-132B of NFET 104A and PFET 104B can include metal silicide layers 128A-128B and conductive regions 130A-130B disposed on metal silicide layers 128A-128B, respectively.

In some embodiments, metal silicide layers 128A-128B can include metal silicide and can provide a low resistance interface between respective conductive regions 130A-130B and corresponding S/D regions of finFETs 104A-104B. Examples of metal used for forming the metal silicide are Co, Ti, and Ni.

In some embodiments, conductive regions 130A-130B can further include metal capping layers 129A-129B and metal layers 131A-131B, respectively. Metal capping layers 129A and 129B can be configured as diffusion barriers to prevent oxidation of metal silicide layers 128A-128B and diffusion of other unwanted atoms and/or ions into metal silicide layers 128A-128B during formation of conductive regions 130A-130B. In some embodiments, metal capping layers 129A and 129B can include a single layer or a stack of conductive materials, such as TiN, Ti, Ni, TiSiN, TaN, Ta, and a combination thereof. In some embodiments, metal capping layers 129A and 129B can act as an adhesion-promoting-layer, a glue-layer, a primer-layer, a protective-layer, and/or a nucleation-layer. In some embodiments, metal layers 131A and 131B can include conductive materials, such as W, Al, and Co. In some embodiments, conductive regions 130A-130B can have a horizontal dimension along an X-axis (e.g., width) $130w$ ranging from about 15 nm to about 17 nm. In some embodiments, a ratio of conductive region width $130w$ to underlying epitaxial fin region width $114w$ along an X-axis can be between about 0.8 and about 1.2. If the ratio is less than about 0.8, conductive region width $130w$ can be too small and could decrease device DC performance. If the ratio is greater than about 1.2, conductive region width $130w$ can be too large and could electrically short gate structures and S/D contact structures. The device may also have channel punch through.

Dielectric layer 138 can be formed between air-replaced spacers 120 and S/D contact structures 132A-132B. Dielectric layer 138 can prevent silicide extrusion into air-replaced spacers 120 and damage of epitaxial fin regions 114A and 114B. Silicide extrusion into air-replaced spacers 120 can reduce the volume in air-replaced spacers 120, thus increasing the capacitance between gate structure 110 and S/D contact structures 132A-132B and decreasing the device AC performance. This protection can be provided, for example, during formation of air-replaced spacers 120. In some embodiments, dielectric layer 138 can include, for example, silicon nitride ($SiN_x$), silicon oxynitride (SiON), silicon carbide (SiC), silicon carbo-nitride (SiCN), or a combination thereof. In some embodiments, dielectric layer 138 can include silicon nitride formed by CVD, atomic layer deposition (ALD), or other suitable deposition methods. In some embodiments, dielectric layer 138 can have a horizontal dimension along an X-axis (e.g., thickness) $138t$ ranging from about 0.5 nm to about 1 nm.

Seal spacer 140 can be formed on air-replaced spacers 120 between dielectric layer 138 and gate capping structures 134. Seal spacer 140, together with ESL 126 and dielectric layer 138, can seal air in air-replaced spacers 120. In some embodiments, seal spacer 140 can include dielectric materials, such as silicon oxycarbide (SiOC), silicon nitride ($SiN_x$), silicon oxynitride (SiON), silicon carbide (SiC), silicon carbo-nitride (SiCN), silicon oxycarbonitride (SiOCN), and a combination thereof. In some embodiments, seal spacer 140 can be formed by CVD or other suitable deposition methods. In some embodiments, seal spacer 140 can have a vertical dimension along a Z-axis (e.g., height) $140h$ ranging from about 5 nm to about 10 nm. If $140h$ is less than about 5 nm, air-replaced spacers 120 may not be properly sealed. If $140h$ is greater than about 10 nm, vertical $120h$ of air-replaced spacers 120 can be smaller and the device AC performance may not be improved. In some embodiments, a ratio of $140h$ to $120h$ can range from about 0.3 to about 1.3. If the ratio is less than about 0.3, air-replaced spacers 120 may not be properly sealed. If the ratio is greater than about 1.3, vertical dimension $120h$ of air-replaced spacers 120 can be smaller and the device AC performance may not be improved.

Figure 2:
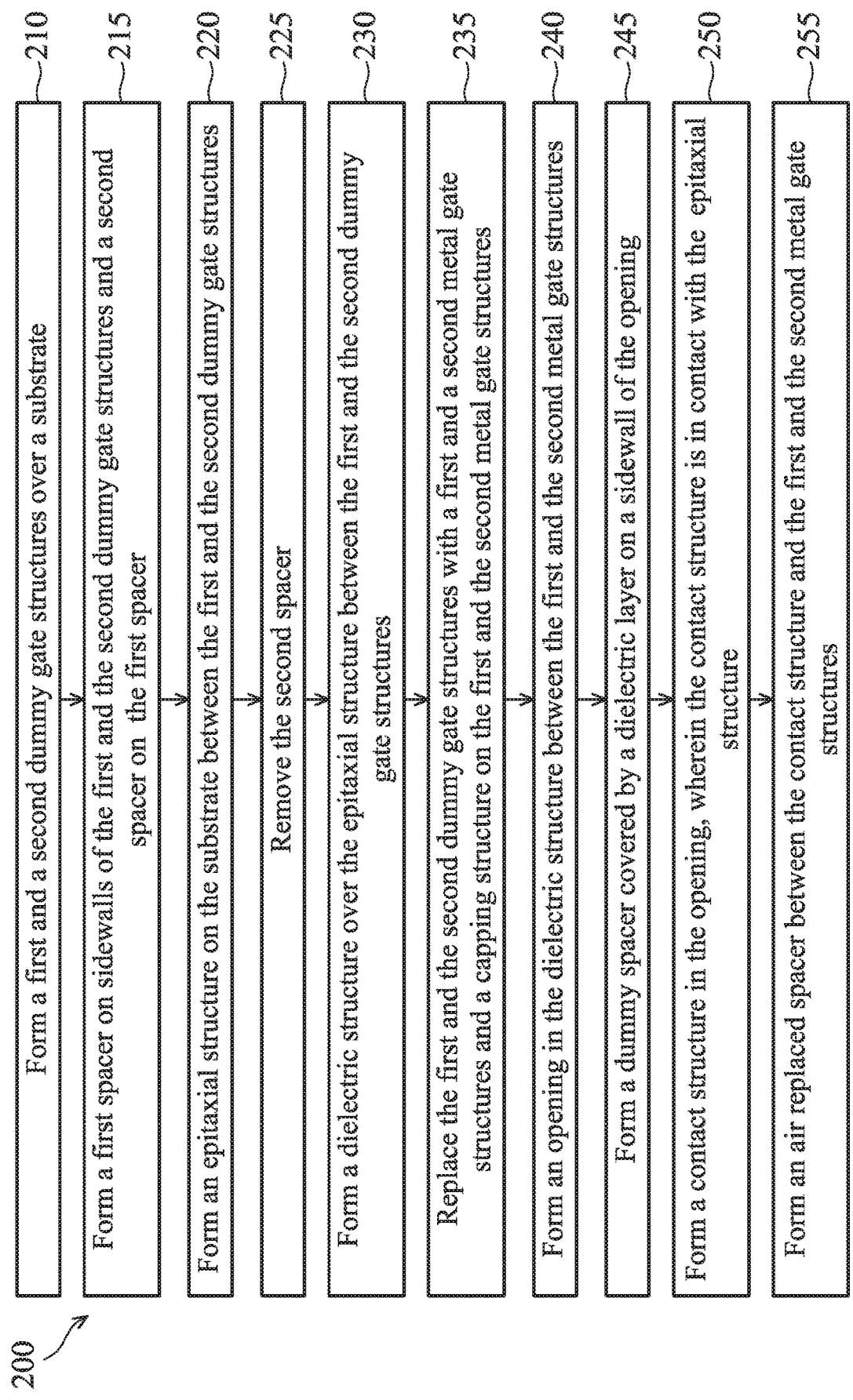
FIG. 2 is a flow diagram of a method for fabricating a semiconductor device with air-replaced spacers, in accordance with some embodiments.

FIG. 2 is a flow diagram of a method 200 for fabricating semiconductor device 100 with air-replaced spacers, in accordance with some embodiments. Additional fabrication operations may be performed between various operations of method 200 and may be omitted merely for clarity and ease of description. Additionally, some of the operations may be performed simultaneously, or in a different order than the ones shown in FIG. 2. Accordingly, it is understood that additional processes can be provided before, during, and/or after method 200, and that these additional processes can be briefly described herein. For illustrative purposes, the operations illustrated in FIG. 2 will be described with reference to the example fabrication process for fabricating semiconductor device 100 as illustrated in FIGS. 3-12. FIGS. 3-12 are cross-sectional views of semiconductor device 100 along line B-B' of semiconductor device 100 at various stages of its fabrication, according to some embodiments. Although FIGS. 3-12 illustrate fabrication process of air-replaced spacers 120 on NFET 104A, method 200 can be applied to PFET 104B and other devices. Elements in FIGS. 3-12 with the same annotations as elements in FIGS. 1A and 1B are described above.

Figure 3:
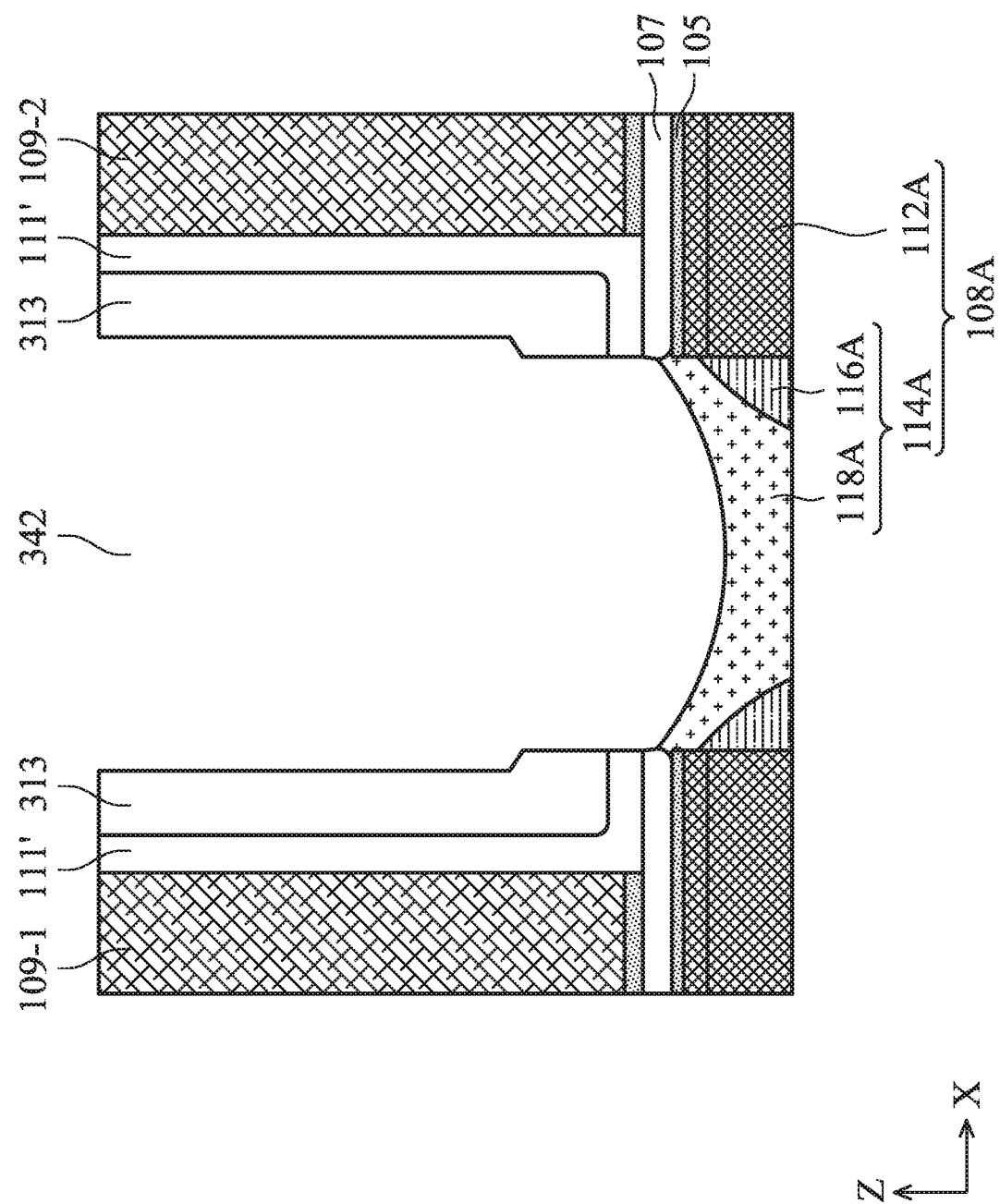
FIGS. 3-12 illustrate cross-sectional views of a semiconductor device with air-replaced spacers at various stages of its fabrication process, in accordance with some embodiments.

In referring to FIG. 2, method 200 begins with operation 210 and the process of forming a first and a second dummy gate structures over a substrate. For example, as shown in FIG. 3, first and second dummy gate structures 109-1 and 109-2 can be formed on fin structures 108A over substrate 102. In some embodiments, first and second dummy gate structures 109-1 and 109-2 can include polysilicon structures. In some embodiments, first and second dummy gate structures 109-1 and 109-2 can be formed by a blanket deposition of polysilicon, followed by photolithography and etching of the deposited polysilicon. The deposition process can include CVD, ALD, physical vapor deposition (PVD), other suitable deposition methods, or a combination thereof. The photolithography can include photoresist coating (e.g., spin-on coating), soft baking, mask aligning, exposure, post-exposure baking, developing the photoresist, rinsing, drying (e.g., hard baking), other suitable processes, or a combination thereof. The etching process can include dry etching, wet etching, and/or other etching methods (e.g., reactive ion etching). In some embodiments, a hard mask layer (not shown) can be patterned on first and second dummy gate structures 109-1 and 109-2 to protect first and second dummy gate structures 109-1 and 109-2 from subsequent processing steps.

In operation 215 of FIG. 2, a first spacer is formed on sidewalls of the first and second dummy gate structures and a second spacer is formed on the first spacer. For example, as shown in FIG. 3, first gate spacer 111' can be formed on sidewalls of first and second dummy gate structures 109-1 and 109-2 and second gate spacer 313 can be formed on first gate spacer 111'. In some embodiments, first gate spacer 111' and second gate spacer 313 can be blanket deposited on exposed surfaces of dummy gate structures and fin structures, followed by photolithography and etching of the deposited spacers and underlying fin base regions. The deposition process can include CVD, ALD, physical vapor deposition (PVD), other suitable deposition methods, or a combination thereof. The photolithography can include masking a portion of device 100 (e.g., p-type MOSFET) to etch the other portion of device 100 (e.g., n-type MOSFET). The etching process can include dry etching and/or other directional etching methods (e.g., reactive ion etching). First gate spacer 111', second gate spacer 313, and portions of fin base regions 112A between dummy gate structures can be recessed for subsequent growth of epitaxial fin regions 114A. Opening 342 can be formed after the etching processes.

In some embodiments, first spacer 111' and second spacer 313 can include insulating material, such as silicon oxide, silicon nitride, a low-k material, and a combination thereof. First spacer 111 and second spacer 313 can have a low-k material with a dielectric constant less than 3.9 (e.g., less than 3.5, 3, or 2.8). In some embodiments, first spacer 111' and second spacer 313 can include a single layer or multiple layers of insulating materials. In some embodiments, first spacer 111' and second spacer 313 can include different insulating materials and have different etch rates. In some embodiments, first gate spacer 111' and second gate spacer 313 can protect gate structure 110 during subsequent processes.

In operation 220 of FIG. 2, an epitaxial structure is formed on the substrate between the first and the second dummy gate structures. For example, as shown in FIG. 3, epitaxial fin regions 114A can be formed on substrate 102 in opening 342 between first and second dummy gate structures 109-1 and 109-2. In some embodiments, epitaxial fin regions 114A can include first epitaxial fin sub-regions 116A and second epitaxial fin sub-regions 118A. First and second epitaxial fin sub-regions 116A and 118A can have different n-type dopant concentrations, according to some embodiments. In some embodiments, second epitaxial fin sub-regions 118A can have a higher dopant concentration than first epitaxial fin sub-regions 116A. In some embodiments, epitaxial fin region 114A can be grown by (i) chemical vapor deposition (CVD), such as low pressure CVD (LPCVD), atomic layer CVD (ALCVD), ultrahigh vacuum CVD (UHVCVD), reduced pressure CVD (RPCVD), and any other suitable CVD; (ii) molecular beam epitaxy (MBE) processes; (iii) any suitable epitaxial process; or (iv) a combination thereof.

Figure 4:
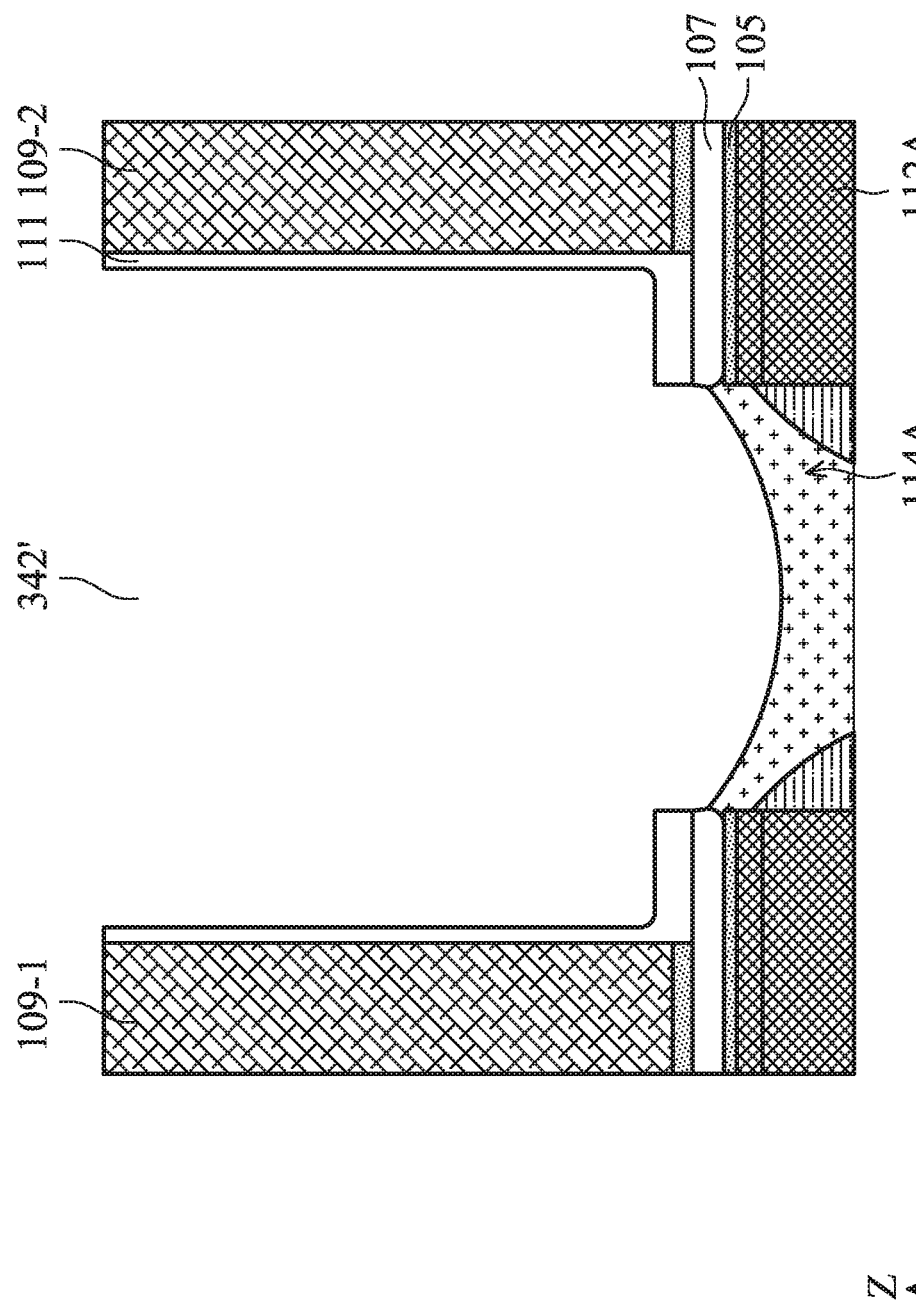

Referring to FIG. 2, in operation 225, the second spacer is removed. For example, as shown in FIG. 4, second gate spacer 313 can be etched to form opening 342' using a dry etching process. The removal of second gate spacer 313 can also be referred to as "second gate spacer 313 trim." In some embodiments, the dry etching process can include using a fluorocarbon-based etchant, such as $C_4F_6$, mixed with hydrogen or oxygen. In some embodiments, the flow rate of the fluorocarbon-based etchant used in the dry etching process can range from about 5 sccm to about 200 sccm. In some embodiments, the dry etching process can be performed at a pressure ranging from about 1 mTorr to about 100 mTorr. In some embodiments, the dry etching process can be performed with a plasma power ranging from about 50 W to about 250 W. In some embodiments, during removal of second gate spacer 313, a portion of first gate spacer 111' can be etched and form gate spacer 111. In some embodiments, first gate spacer 111' can be etched about 0.5 nm during the removal of second gate spacer 313.

Figure 5:
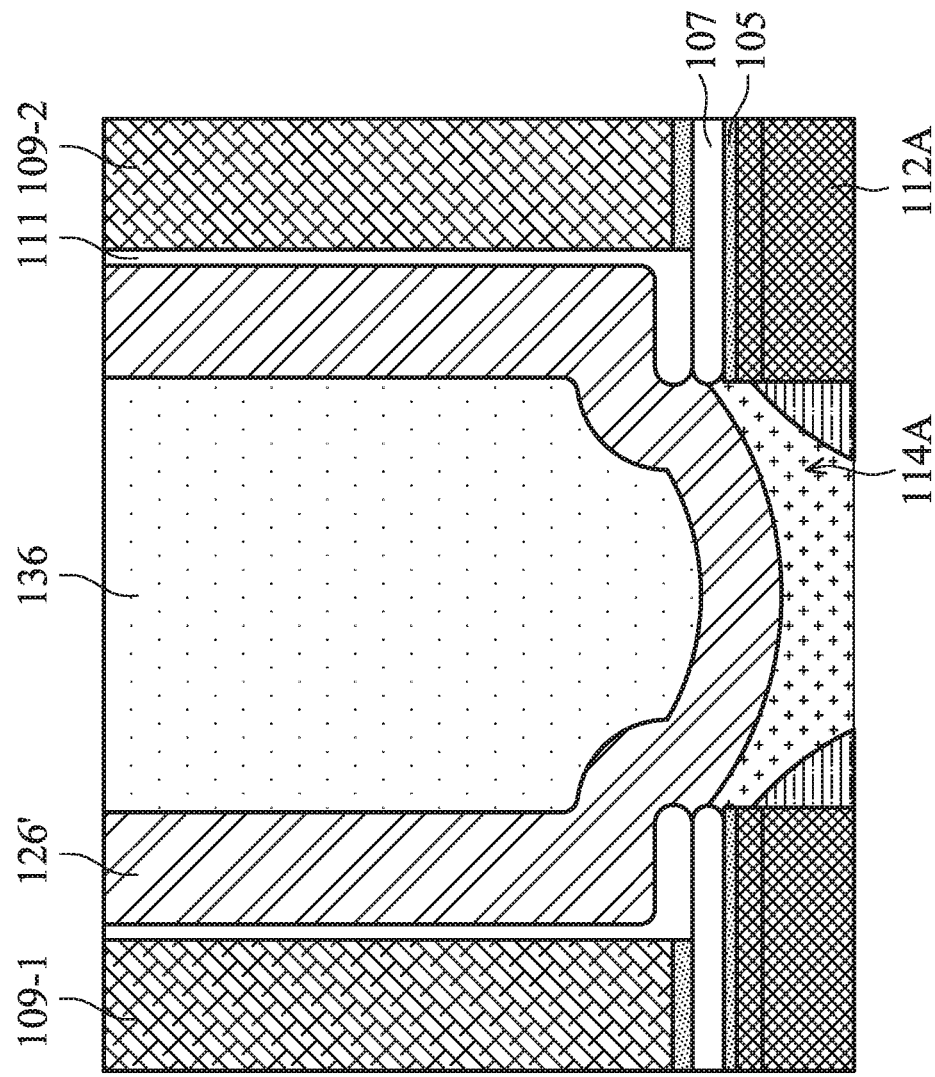

In operation 230 of FIG. 2, a dielectric structure is formed over the epitaxial structure between the first and the second dummy gate structures. For example, as shown in FIG. 5, ILD layer 136 can be formed over epitaxial fin regions 114A between first and second dummy gate structures 109-1 and 109-2. In some embodiments, ILD layer 136 can have a larger width along an X-axis than an ILD layer without removal of second gate spacer 313, thus increasing the width of S/D contact structures formed in subsequent processes and improving DC performance of CMOS transistors. In some embodiments, prior to the formation of ILD layer 136, ESL 126' can be formed as shown in FIG. 5. In some embodiments, ESL 126' can include, for example, $SiN_x$, SiON, SiC, SiCN, BN, SiBN, SiCBN, or a combination thereof. In some embodiments, ESL 126' can include silicon nitride formed by CVD having a thickness in a range from about 1 nm to about 30 nm.

The formation of ILD layer 136 can include a blanket deposition of an ILD material followed by a CMP process. LD layer 136 can be blanket deposited on and between first and second dummy gate structures 109-1 and 109-2 using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide can be deposited using flowable CVD (FCVD). In some embodiments, the dielectric material can include silicon oxide. The CMP process can be performed after the blanket deposition of ILD layer 136 to coplanarize a top surface of ILD layer 136, ESL 126, gate spacer 111, as well as first and second dummy gate structures 109-1 and 109-2.

Figure 6:
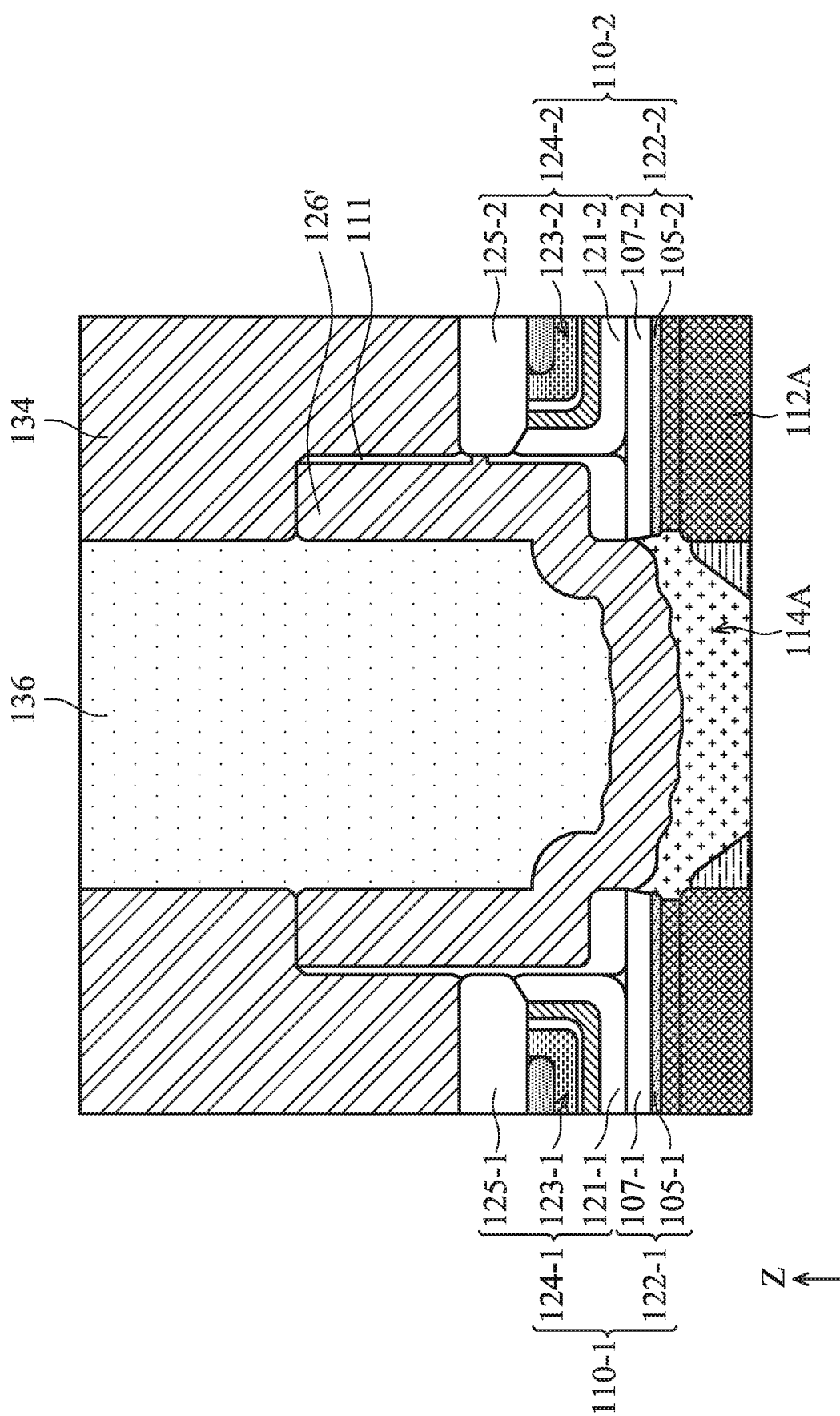

Referring to FIG. 2, in operation 235, the first and the second dummy gate structures are replaced with first and second metal gate structures and a capping structure on the first and the second metal gate structures. For example, as shown in FIG. 6, first and second dummy gate structures 109-1 and 109-2 can be replaced with first and second metal gate structures 110-1 and 110-2 having a gate capping structure 134 thereon. As described above, metal gate structure 110 can include gate dielectric layer 122 and gate electrode 124. Gate dielectric layer 122 can further include interfacial oxide layer 105 and high-k dielectric layer 107. Gate electrode 124 can further include gate barrier layer 121, gate work function metal layer 123, and gate metal fill layer 125. In some embodiments, the replacement of metal gate structures can include removal of dummy gate structures and deposition of a gate barrier layer, a gate work function metal layer, and a gate metal fill layer followed by CMP of the deposited metal fill layer.

In some embodiments, portions of metal gate structures can be etched and a gate capping structure can be formed on the etched metal gate structures. For example, as shown in FIG. 6, gate capping structures 134 can be formed on gate structures 110-1 and 110-2. In some embodiments, gate capping structures 134 can protect the underlying structures and/or layers during subsequent processing. In some embodiments, gate capping structures 134 act as an etch stop layer during the formation of S/D contact structure 132A.

Figure 7:
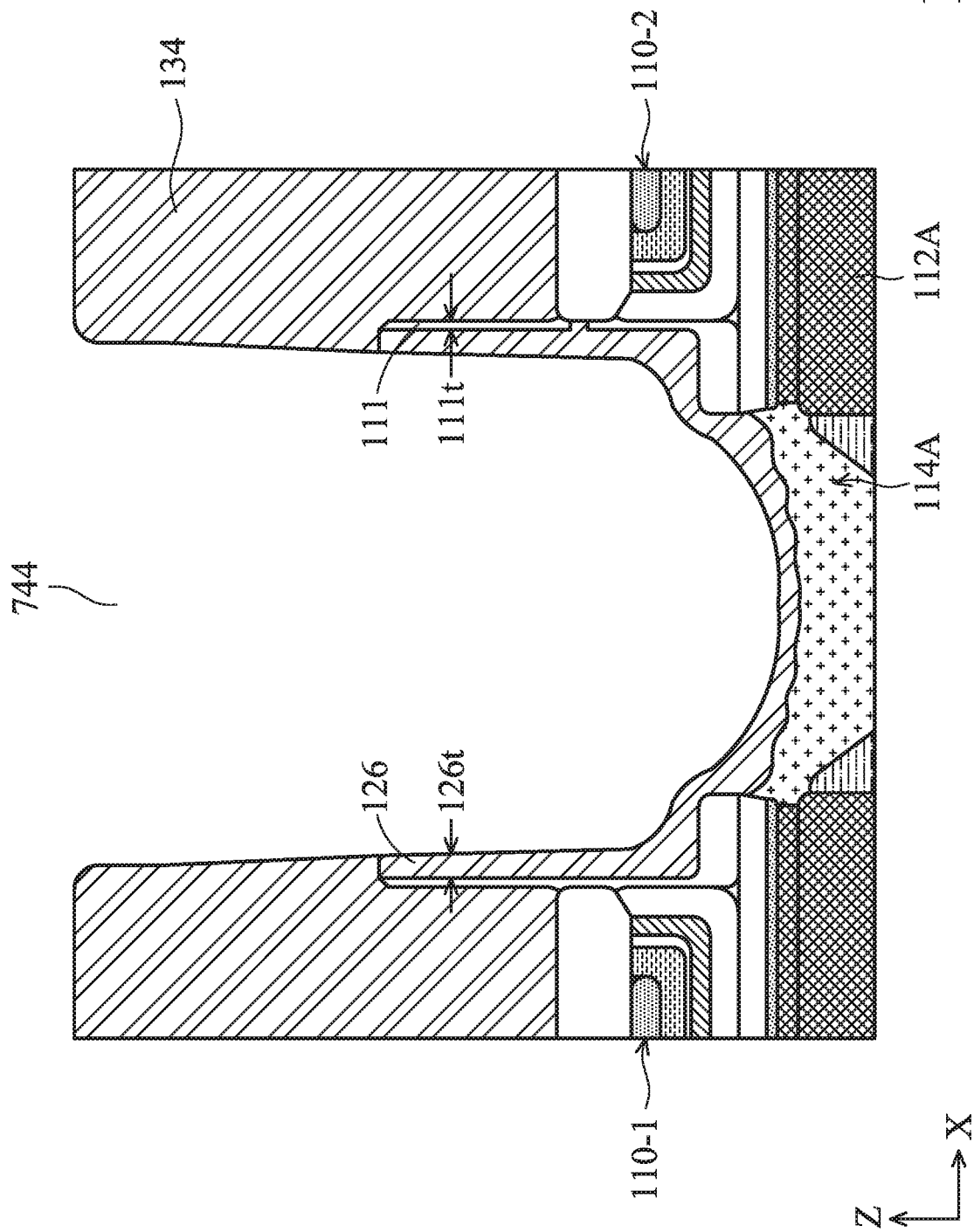

In operation 240 of FIG. 2, an opening is formed in the dielectric structure between the first and the second metal gate structures. For example, as shown in FIG. 7, opening 744 can be formed in ILD layer 136 between first and second gate structures 110-1 and 110-2. In some embodiments, opening 744 can be formed using a dry etching process. In some embodiments, the dry etching process can include using a fluorocarbon-based etchant, such as $C_4F_6$, mixed with hydrogen or oxygen. In some embodiments, the flow rate of the fluorocarbon-based etchant can range from about 5 sccm to about 200 sccm. In some embodiments, the dry etching process can be performed at a pressure ranging from about 1 mTorr to about 100 mTorr. In some embodiments, the dry etching process can be performed with a plasma power ranging from about 50 W to about 250 W. In some embodiments, the dry etching process can stop on ESL 126. In some embodiments, after the dry etching process, ESL 126 can have a thickness 126t along an X-axis in a range from about 1 nm to about 5 nm. In some embodiments, ESL 126 can prevent silicide extrusion into air-replaced spacers 120 during subsequent processes. In some embodiments, opening 744 can have a larger width along an X-axis than an opening between first and second gate structures 110-1 and 110-2 without removal of second gate spacer 313, thus increasing the width of S/D contact structures formed in subsequent processes and improving DC performance of CMOS transistors.

Figure 8:
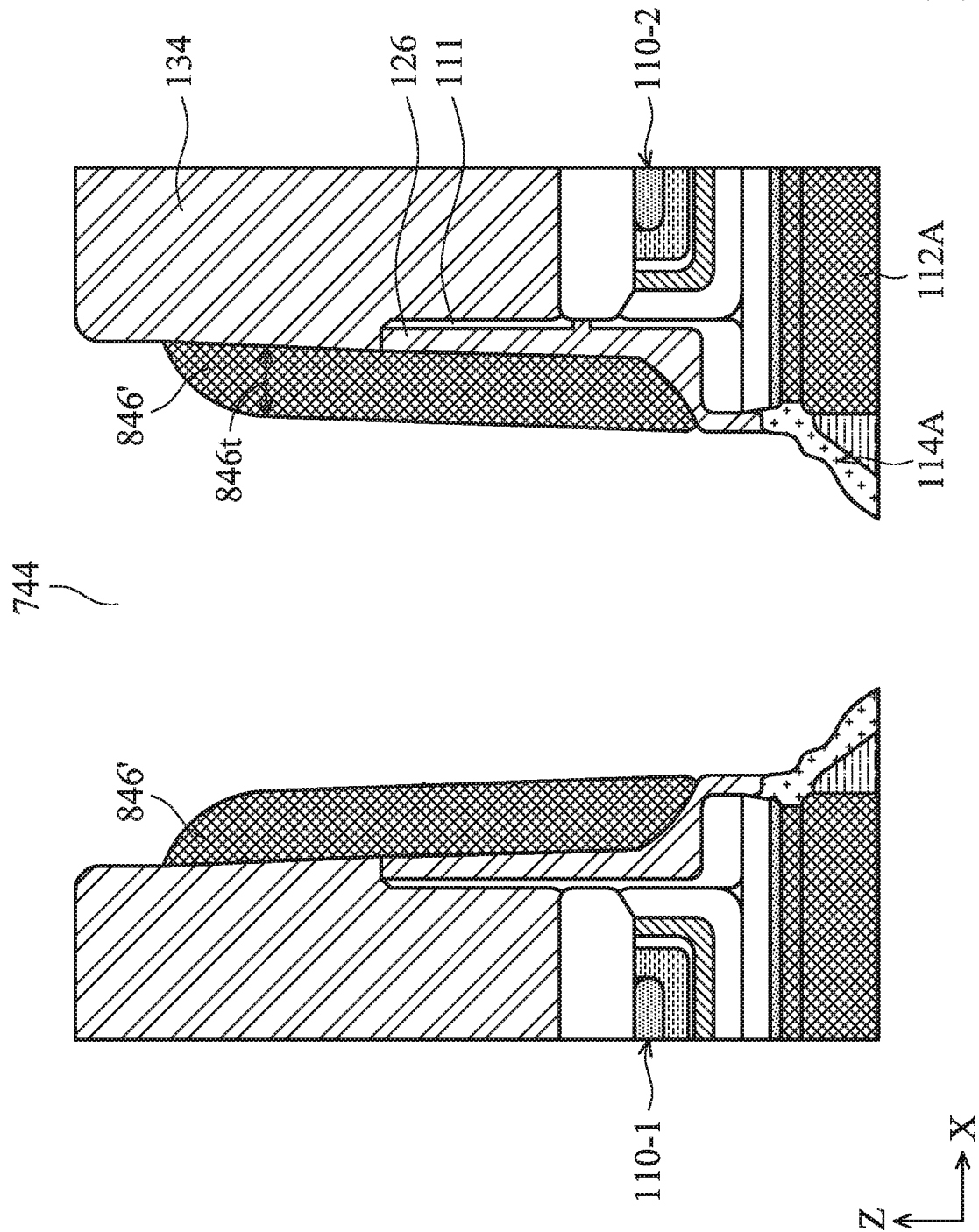
Figure 9:
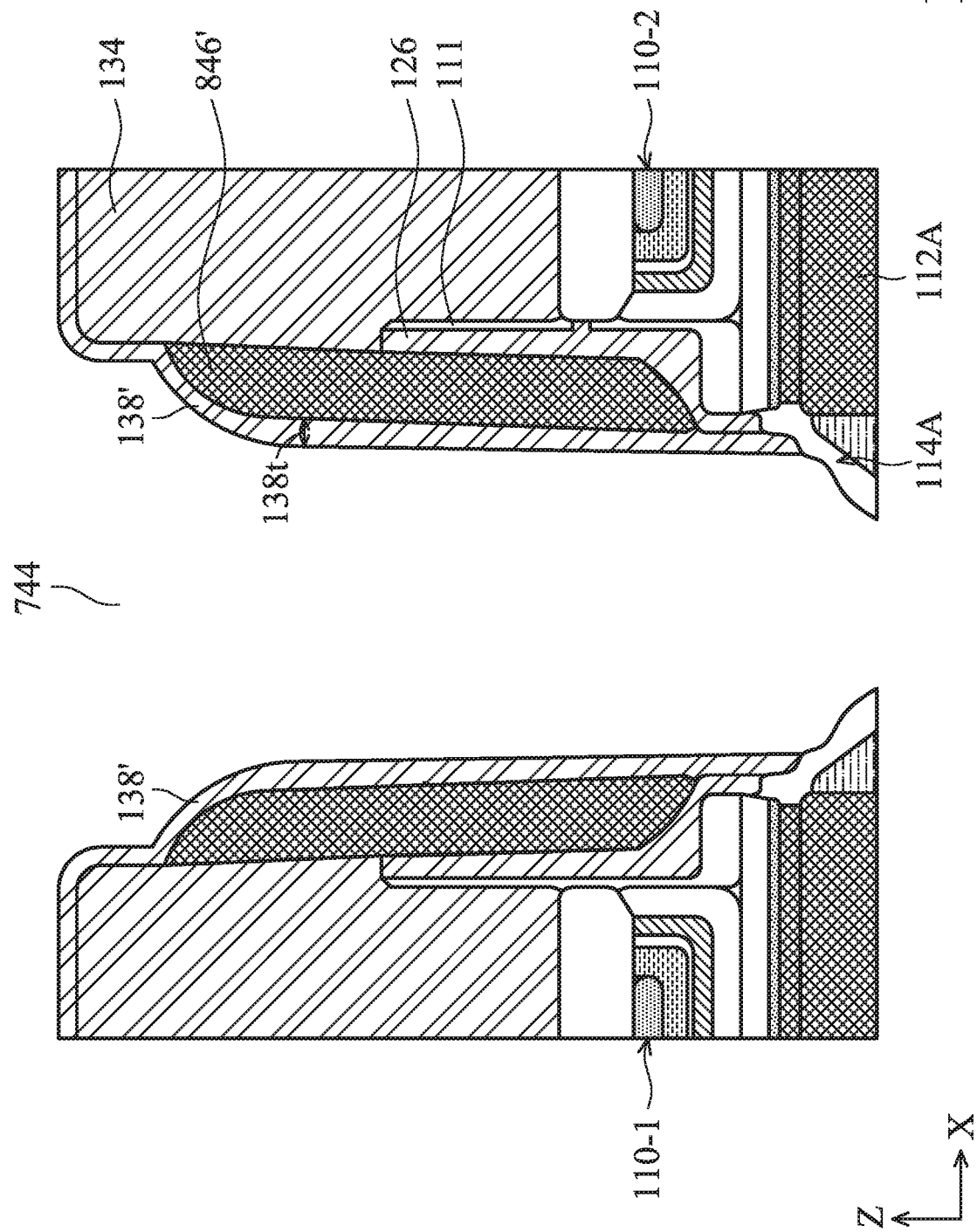

Referring to FIG. 2, in operation 245, a dummy spacer covered by a dielectric layer is formed on a sidewall of the opening. For example, as shown in FIGS. 8 and 9, dummy spacer 846' can be formed on sidewalls of opening 744 and covered with dielectric layer 138'. In some embodiments, dummy spacer 846' can include silicon and/or other suitable materials. In some embodiments, the formation of dummy spacer 846' can include conformally depositing a dummy spacer layer and etching portions of the dummy spacer layer to form dummy spacer 846'.

In some embodiments, the dummy spacer layer can be conformally deposited in opening 744 by CVD and/or other suitable deposition methods. In some embodiments, the dummy spacer layer can be conformally deposited in opening 744 by a CVD process using reaction gases, such as silane ($SiH_4$) and disilane ($Si_2H_6$) as precursors at a temperature ranging from about 50° C. to about 900° C. In some embodiments, the conformal deposition of dummy spacer layer can be performed at a pressure ranging from about 1 Torr to about 10 Torr. In some embodiments, the conformally deposited dummy spacer layer can have a thickness ranging from about 2 nm to about 4 nm. In some embodiments, the thickness of the dummy spacer layer can affect the etching of the dummy spacer layer. If the thickness is thinner than about 2 nm, air-replaced spacers 120 may have dummy spacer residue near the bottom. If the thickness is thicker than about 4 nm, air-replaced spacers 120 may not be sealed.

The conformal deposition of dummy spacer layer can be followed by etching portions of dummy spacer layer to form dummy spacer 846'. In some embodiments, the conformally deposited dummy spacer layer can be etched using a dry etching process. In some embodiments, the dry etching process can include using a fluorine- or chlorine-based etchant mixed with hydrogen or oxygen. In some embodiments, the flow rate of the fluorine- or chlorine-based etchant used in the dry etching process can range from about 5 sccm to about 200 sccm. In some embodiments, the dry etching process can be performed at a pressure ranging from about 1 mTorr to about 100 mTorr. In some embodiments, the dry etching process can be performed with a plasma power ranging from about 50 W to about 250 W. After the dry etching process, portions of the dummy spacer layer at the bottom of opening 744 can be etched and dummy spacer 846' can be formed on sidewalls of opening 744. In some embodiments, dummy spacer 846' can have a thickness 846t along an X-axis ranging from about 1 nm to about 4 nm. In some embodiments, thickness 846t of dummy spacer 846' can determine the width of subsequently-formed air-replaced spacers 120. In some embodiments, portions of ESL 126 on epitaxial fin regions 114A can be etched during the dry etching process. In some embodiments, a portion of epitaxial fin regions 114A can be etched during the dry etching process.

The formation of dummy spacer 846' can be followed by the formation of dielectric layer 138'. In some embodiments, the formation of dielectric layer 138' can include conformally depositing a dielectric layer and etching of the dielectric layer to form dielectric layer 138'. In some embodiments, dielectric layer 138' can include silicon nitride and/or other dielectric materials. In some embodiments, dielectric layer 138' can have a horizontal dimension along an X-axis (e.g., thickness) 138t ranging from about 0.5 nm to about 1 nm.

In some embodiments, the dielectric layer can be conformally deposited by CVD, ALD, and/or other suitable deposition methods. In some embodiments, the dielectric layer can be conformally deposited by a CVD process using reaction gases, such as Dichlorosilane (DCS) and Ammonia ($NH_3$) as precursors at a temperature ranging from about 50° C. to about 900° C. In some embodiments, the conformal deposition of the dielectric layer can be performed at a pressure ranging from about 1 Torr to about 10 Torr. In some embodiments, the conformally deposited dielectric layer can have a thickness ranging from about 1 nm to about 2 nm.

Following the conformal deposition of the dielectric layer, the dielectric layer can be etched to form dielectric layer 138'. In some embodiments, the conformally deposited dielectric layer can be etched using a dry etching process. In some embodiments, the dry etching process can include using a fluorocarbon-based etchant, such as $C_4F_6$, mixed with hydrogen or oxygen. In some embodiments, the flow rate of the fluorocarbon-based etchant can range from about 5 sccm to about 200 sccm. In some embodiments, the dry etching process can be performed at a pressure ranging from about 1 mTorr to about 100 mTorr. In some embodiments, the dry etching process can be performed with a plasma power ranging from about 50 W to about 250 W. In some embodiments, after the dry etching process, the portion of the dielectric layer on epitaxial fin regions 114A can be etched to expose top surfaces of epitaxial fin regions 114A for subsequent formation of S/D contact structures.

Figure 10:
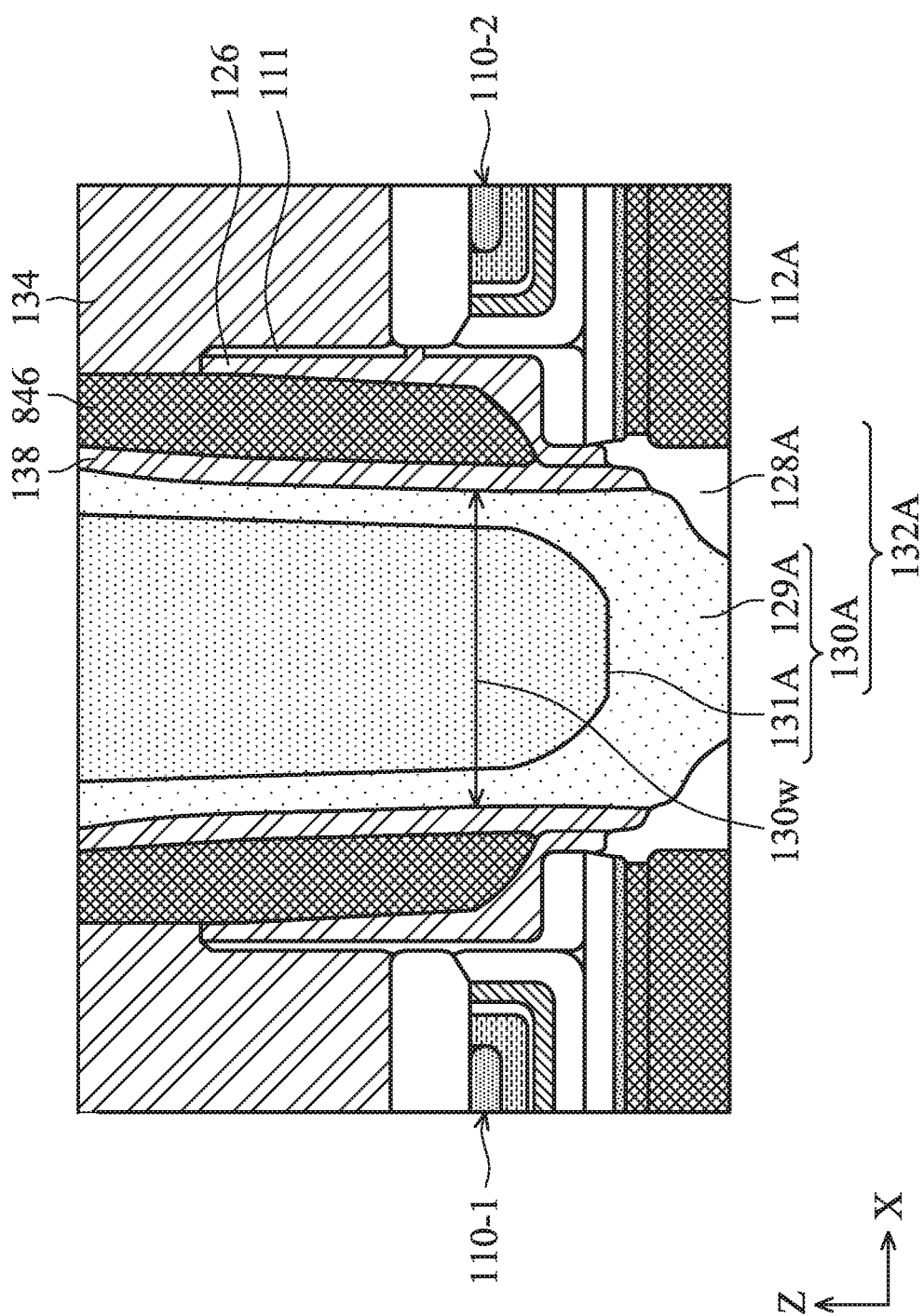

Referring to FIG. 2, in operation 250, a contact structure is formed in the opening. For example, as shown in FIG. 10, S/D contact structure 132A can be formed in opening 744. And S/D contact structure 132A can be in contact with epitaxial fin regions 114A (shown in FIGS. 1A and 1B). In some embodiments, S/D contact structure 132A can electrically connect S/D regions (e.g., epitaxial fin regions 114A) of finFET 104A to other elements of semiconductor device 100 and/or of the integrated circuit. S/D contact structure 132A can be formed within ILD layer 136 (shown in FIG. 1A).

According to some embodiments, the formation of S/D contact structure 132A can include the formation of metal silicide layer 128A and conductive regions 130A on metal silicide layer 128A, as shown in FIG. 10. The formation of metal silicide layer 128A can include deposition of a metal layer and silicidation of the deposited metal layer. In some embodiments, dielectric layer 138 prevents formation of metal silicide layer in dummy spacer 846, thus preventing silicide extrusion into air-replaced spacers 120. Without dielectric layer 138, the metal layer can be deposited on dummy spacer 846 and form metal silicide, which may not be removed during subsequent removal of dummy spacer 846 to form air-replaced spacers 120. Having metal silicide layer in air-replaced spacers 120 can reduce the volume of the air-replaced spacers 120 and increase the dielectric constant between the gate structure and the S/D contact structure, thus increasing the capacitance between the gate structure and the S/D contact structure.

In some embodiments, conductive region 130A can further include metal capping layer 129A and metal layer 131A, as described above. The formation of conductive region 130A can include deposition of metal capping layer 129A and metal layer 131A, followed by CMP of the deposited metals. In some embodiments, the CMP process can be stopped when dummy spacer 846 is exposed for subsequent etching process. In some embodiments, metal capping layer 129A can include a single layer or a stack of conductive materials, such as TiN, Ti, Ni, TiSiN, TaN, Ta, and a combination thereof. In some embodiments, metal capping layer 129A can be deposited by CVD, ALD, or other suitable deposition processes. In some embodiments, metal layer 131A can include conductive materials, such as W, Al, and Co. In some embodiments, metal layer 131A can be deposited by CVD, ALD, PVD, or other suitable deposition processes. In some embodiments, conductive region 130A can have a horizontal dimension along an X-axis (e.g., width) 130w ranging from about 15 nm to about 17 nm. In some embodiments, a ratio of conductive region width 130w to the width 114w of underlying epitaxial fin region 114A along an X-axis can be between about 0.8 and about 1.2. If the ratio is less than about 0.8, conductive region width 130w can be too small, thus degrading device DC performance. If the ratio is greater than about 1.2, conductive region width 130w can be too large and could cause an electrical short between gate structures and S/D contact structures. The device may also have channel punch through.

Figure 11:
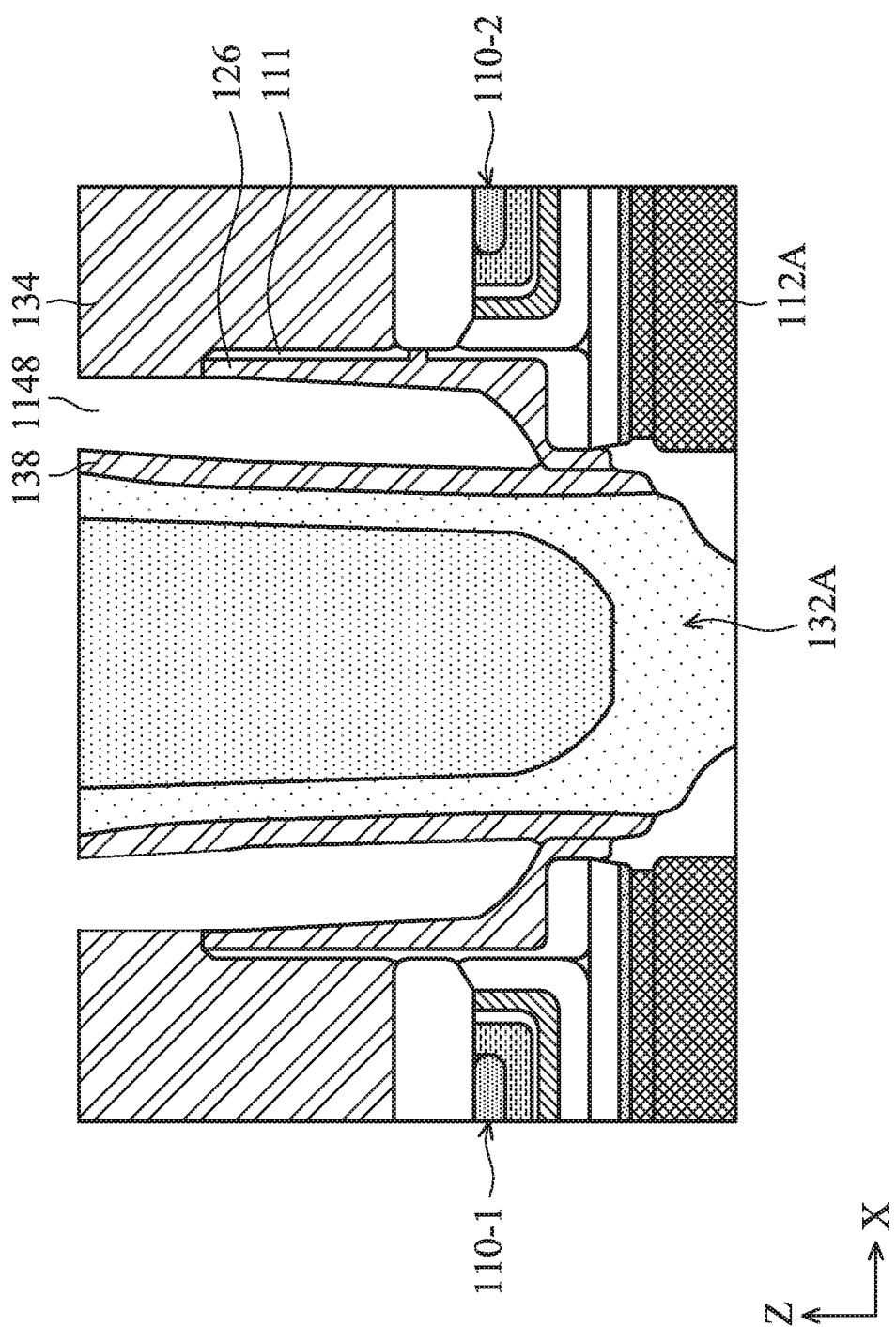
Figure 12:
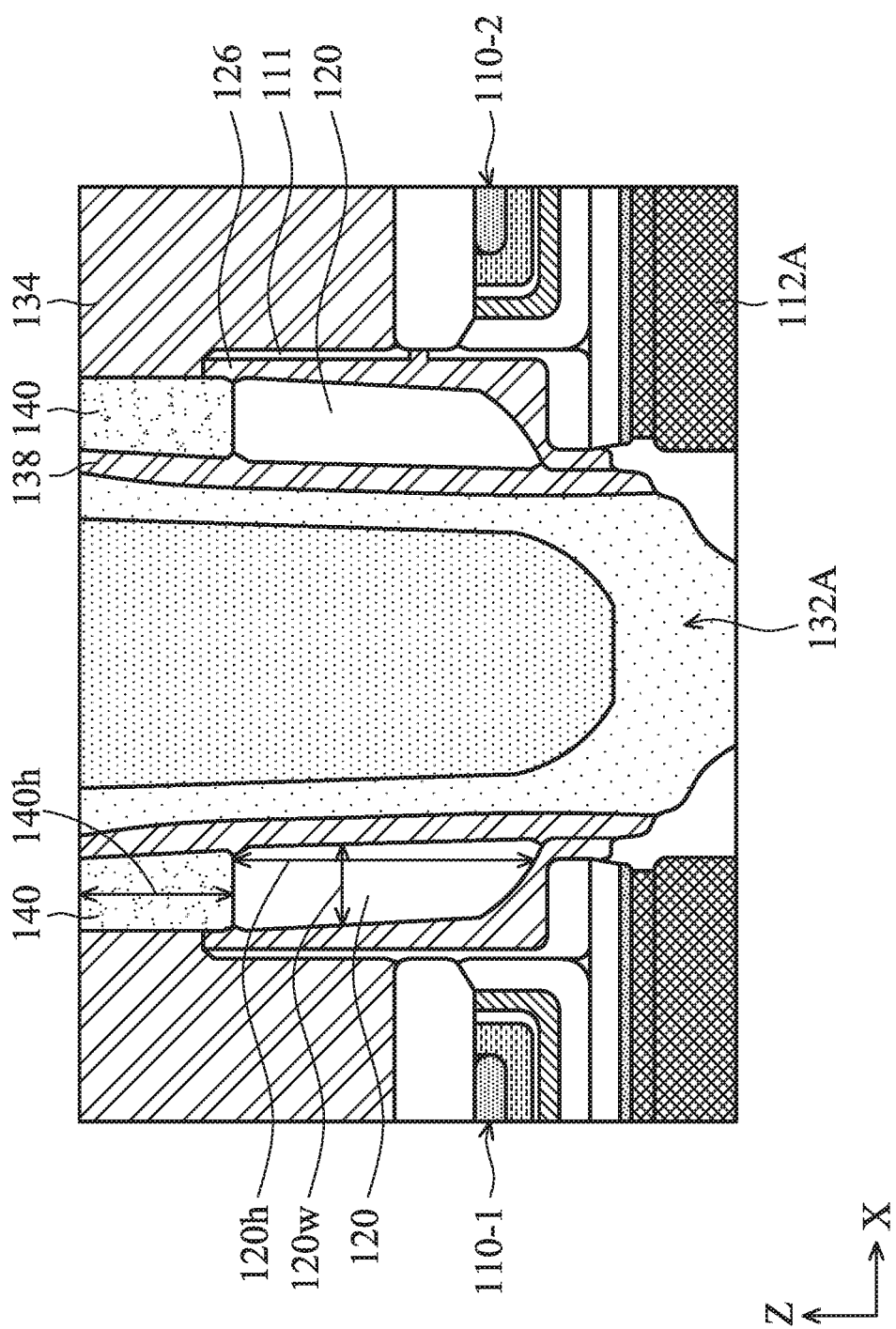

Referring to FIG. 2, in operation 255, an air-replaced spacer is formed between the contact structure and the first and the second metal gate structures. For example, as shown in FIGS. 11 and 12, air-replaced spacers 120 can be formed between S/D contact structure 132A and first and second gate structures 110-1 and 110-2. In some embodiments, the formation of air-replaced spacers 120 can include formation of air gap 1148 and deposition of seal spacer 140. In some embodiments, the formation of air gap 1148 can include an etch process. In some embodiments, the etch process can include a dry etching process. In some embodiments, the dry etching process can include using a fluorine- or chlorine-based etchant mixed with hydrogen or oxygen. In some embodiments, the flow rate of the fluorine- or chlorine-based etchant used in the dry etching process can range from about 5 sccm to about 200 sccm. In some embodiments, the dry etching process can be performed at a pressure ranging from about 1 mTorr to about 100 mTorr. In some embodiments, the dry etching process can be performed with a plasma power ranging from about 50 W to about 250 W. After the etch process, air gap 1148 can be formed to replace dummy spacer 846.

Following the formation of air gap 1148, seal spacer 140 can be formed on a top portion of air gap 1148. In some embodiments, the formation of seal spacer 140 can further include blanket deposition of a spacer layer followed by a CMP process. In some embodiments, the spacer layer can include silicon nitride, silicon oxycarbide (SiOC), silicon carbo-nitride (SiCN), silicon oxycarbonitride (SiOCN), and/or other suitable materials.

In some embodiments, the spacer layer can be blanket deposited by CVD and/or other suitable deposition methods. In some embodiments, the spacer layer can be blanket deposited by a CVD process using reaction gases, such as silicon- and carbon-based precursors, at a temperature ranging from about 50° C. to about 900° C. In some embodiments, the spacer layer can include SiOC and can be blanket deposited using oxygen-containing reaction gas in addition to silicon- and carbon-based precursors. In some embodiments, the spacer layer can include SiCN and can be blanket deposited using a nitrogen-containing reaction gas in addition to silicon- and carbon-based precursors. In some embodiments, the spacer layer can include SiOCN and can be blanket deposited using oxygen- and nitrogen-containing reaction gases in addition to silicon- and carbon-based precursors. In some embodiments, blanket deposition of the spacer layer can be performed at a pressure ranging from about 1 Torr to about 10 Torr. In some embodiments, the blanket deposition of the spacer layer can have a deposition rate higher than about 0.1 nm/min. In some embodiments, with a deposition rate higher than about 0.1 nm/min, blanket deposition of the spacer layer can seal air gap 1148 at the top portions to form air-replaced spacers 120, rather than filling air gap 1148. In some embodiments, with a deposition rate higher than about 0.1 nm/min, spacer layer can grow faster at the top corners than the inside of air gap 1148, which can seal the top portions of air gap 1148. In some embodiments, air-replaced spacers 120 can have a horizontal dimension along an X-axis (e.g., width) 120w ranging from about 1 nm to about 4 nm. In some embodiments, air-replaced spacers 120 can have a vertical dimension along a Z-axis (e.g., height) 120h ranging from about 8 nm to about 16 nm.

The CMP process can be performed after the blanket deposition of the spacer layer to coplanarize a top surface of gate capping structures 134, ILD layer 136, dielectric layer 138, seal spacer 140, and S/D contact structure 132A. In some embodiments, the CMP process can stop on S/D contact structure 132A. In some embodiments, seal spacer 140 can seal air-replaced spacers 120 after the CMP process. In some embodiments, after CMP of the blanket deposited spacer layer, seal spacer 140 can have a vertical dimension along a Z-axis (e.g., height) 140h ranging from about 5 nm to about 10 nm.

Various embodiments in accordance with the present disclosure provide methods for forming air-replaced spacers 120 with second gate spacer 313 trim to reduce the capacitance between gate structure 110 and S/D contact structures 132A-132B. According to some embodiments, air-replaced spacers 120 can be formed between gate structures 110 and S/D contact structures 132A-132B through deposition and partial removal of a dummy silicon layer. In some embodiments, the size (e.g., height 120h and width 120w) of air-replaced spacers 120 can be tuned by the size of dummy spacer 846. In some embodiments, dielectric layer 138 can be formed between dummy spacer 846 and S/D contact structures 132A-132B to prevent silicide extrusion into the air-replaced spacer and damage of epitaxial structures in the source/drain region. In some embodiments, second gate spacer 313 can be etched to increase width 130w of S/D contact structures 132A-132B between adjacent gate structures. In some embodiments, compared with CMOS transistors without air-replaced spacers, CMOS transistors having air-replaced spacers 120 with second gate spacer 313 trim can have comparable direct current (DC) performance and improved device AC performance. In some embodiments, device AC performance of CMOS transistors having air-replaced spacers 120 with second gate spacer 313 trim can be improved by at least about 1.5%.

In some embodiments, a method includes forming a dummy gate structure over a substrate, forming a first spacer on a sidewall of the dummy gate structure and a second spacer on the first spacer, forming a source/drain structure on the substrate, removing the second spacer, forming a dielectric structure over the source/drain structure, replacing the dummy gate structure with a metal gate structure and a capping structure on the metal gate structure, and forming an opening in the dielectric structure. The opening exposes the source/drain structure. The method further includes forming a dummy spacer on a sidewall of the opening, forming a contact structure in the opening, and removing the dummy spacer to form an air gap between the contact structure and the metal gate structure. The contact structure is in contact with the source/drain structure in the opening.

In some embodiments, a method includes forming a first and a second dummy gate structures over a substrate, forming a first spacer on sidewalls of the first and the second dummy gate structures and a second spacer on the first spacer, forming an epitaxial structure on the substrate between the first and the second dummy gate structures, removing the second spacer, forming a dielectric structure over the epitaxial structure between the first and the second dummy gate structures, replacing the first and the second dummy gate structures with a first and a second metal gate structures and a capping structure on the first and the second metal gate structures, and forming an opening in the dielectric structure between the first and the second metal gate structures. The opening exposes the epitaxial structure. The method further includes forming a dummy spacer on a sidewall of the opening, forming a contact structure in the opening, and forming an air gap between the contact structure and the metal gate structure. The contact structure is in contact with the epitaxial structure.

In some embodiments, a semiconductor structure includes a fin structure on a substrate, a gate structure over the fin structure, a gate spacer on a sidewall of the gate structure, a source/drain structure on the fin structure, a contact structure on the source/drain structure, and an air spacer between the contact structure and the metal gate structure. A ratio of a first width of the contact structure to a second width of the source/drain structure along the direction of the fin structure ranges from about 0.8 to about 1.2.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a dummy gate structure over a substrate;
   forming a first spacer on a sidewall of the dummy gate structure and a second spacer on the first spacer;
   forming a source/drain structure on the substrate;
   removing the second spacer;
   forming an etch stop layer (ESL) on the source/drain structure and the first spacer;
   forming a dielectric structure on the ESL and over the source/drain structure;
   replacing the dummy gate structure with a metal gate structure and a capping structure on the metal gate structure;
   removing the dielectric structure and a portion of the ESL to form an opening, wherein the opening exposes the source/drain structure;
   forming a dummy spacer on a sidewall of the opening, wherein the dummy spacer is in contact with the ESL;
   forming a contact structure in the opening, wherein the contact structure is in contact with the source/drain structure in the opening; and
   removing the dummy spacer to form an air gap between the contact structure and the metal gate structure, wherein the ESL is in contact with the air gap and the first spacer.

2. The method of claim 1, wherein the forming the dummy spacer comprises:
   depositing a layer of dummy material on the ESL in the opening; and
   removing a portion of the layer of dummy material over the source/drain structure.

3. The method of claim 1, wherein the forming the dummy spacer comprises depositing a layer of silicon on the ESL in the opening.

4. The method of claim 1, further comprising forming a dielectric layer on the dummy spacer and in contact with the ESL.

5. The method of claim 4, wherein the forming the dielectric layer comprises:
   depositing a layer of dielectric material on the ESL and the source/drain structure in the opening; and
   removing a portion of the layer of dielectric material on the source/drain structure.

6. The method of claim 5, wherein the depositing the layer of dielectric material comprises depositing a layer of silicon nitride.

7. The method of claim 1, further comprises:
   forming a seal spacer in an upper portion of the air gap to form an air spacer between the contact structure and the metal gate structure, wherein the seal spacer is between the ESL and the contact structure.

8. A method, comprising:
   forming first and second dummy gate structures over a substrate;
   forming a first spacer on sidewalls of the first and second dummy gate structures and a second spacer on the first spacer;
   forming an epitaxial structure on the substrate between the first and second dummy gate structures;
   removing the second spacer;
   forming an etch stop layer (ESL) on the epitaxial structure and the first spacer;

forming a dielectric structure on the ESL and over the epitaxial structure between the first and second dummy gate structures;

replacing the first and second dummy gate structures with first and second metal gate structures and a capping structure on the first and second metal gate structures;

removing the dielectric structure and a portion of the ESL to form an opening between the first and second metal gate structures, wherein the opening exposes the epitaxial structure;

forming a dummy spacer on a sidewall of the opening, wherein the dummy spacer is in contact with the ESL;

forming a contact structure in the opening, wherein the contact structure is in contact with the epitaxial structure; and removing the dummy spacer to form an air gap between the contact structure and the first metal gate structure, wherein the ESL is in contact with the air gap and the first spacer.

9. The method of claim 8, wherein the forming the dummy spacer comprises:

depositing a layer of dummy material on the ESL in the opening; and removing a portion of the layer of dummy material over the epitaxial structure.

10. The method of claim 8, wherein the forming the dummy spacer comprises depositing a layer of silicon on the ESL in the opening.

11. The method of claim 8, further comprising forming a dielectric layer on the dummy spacer and in contact with the ESL.

12. The method of claim 11, wherein the forming the dielectric layer comprises:

depositing a layer of dielectric material on the ESL and the epitaxial structure in the opening; and removing a portion of the layer of dielectric material on the epitaxial structure.

13. The method of claim 12, wherein the depositing the layer of dielectric material comprises depositing a layer of silicon nitride.

14. The method of claim 8, further comprising:

forming a seal spacer in an upper portion of the air gap to form an air spacer between the contact structure and the first metal gate structure, wherein the seal spacer is between the ESL and the contact structure.

15. A semiconductor device, comprising:

a fin structure on a substrate;

a gate structure over the fin structure;

a gate spacer on a sidewall of the gate structure;

an etch stop layer (ESL) on a sidewall of the gate spacer;

a source/drain structure on the fin structure;

a contact structure on the source/drain structure; and an air spacer in contact with the ESL and between the contact structure and the gate structure.

16. The semiconductor device of claim 15, further comprising a dielectric layer between the air spacer and the contact structure, wherein the dielectric structure is in contact with the ESL.

17. The semiconductor device of claim 16, wherein the dielectric layer comprises silicon nitride.

18. The semiconductor device of claim 15, further comprising a seal spacer, over the air spacer, to seal an air gap between the contact structure and the gate structure, wherein the seal spacer is between the ESL and the contact structure.

19. The semiconductor device of claim 15, wherein the contact structure comprises a silicide layer in contact with the source/drain structure.

20. The semiconductor device of claim 15, wherein the ESL is between the gate spacer and the air spacer.

* * * * *